United States Patent
Lee et al.

(10) Patent No.: US 8,890,899 B2
(45) Date of Patent: Nov. 18, 2014

(54) MONOCHROME LIGHT EMITTING DISPLAY DEVICE AND METHOD FOR FABRICATING THE SAME

(75) Inventors: Se-Hee Lee, Seoul (KR); Byung-Chul Ahn, Seoul (KR); Seung-Kyu Choi, Daegu (KR); Nam-Yang Lee, Seongnam-si (KR); Seok-Jong Lee, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 1094 days.

(21) Appl. No.: 12/646,256

(22) Filed: Dec. 23, 2009

(65) Prior Publication Data

US 2011/0032277 A1 Feb. 10, 2011

(30) Foreign Application Priority Data

Aug. 4, 2009 (KR) .................. 10-2009-0071760

(51) Int. Cl.
| | |
|---|---|
| G06F 3/038 | (2013.01) |
| G09G 5/10 | (2006.01) |
| H01J 9/00 | (2006.01) |
| H01L 51/52 | (2006.01) |
| G09G 3/32 | (2006.01) |
| H01L 27/32 | (2006.01) |

(52) U.S. Cl.
CPC .......... *H01L 51/5281* (2013.01); *G09G 3/3225* (2013.01); *G09G 2300/0452* (2013.01); *G09G 2320/0242* (2013.01); *H01L 27/3244* (2013.01); *H01L 2251/558* (2013.01)

USPC .......................................... 345/690; 345/213

(58) Field of Classification Search
None
See application file for complete search history.

(56) References Cited

U.S. PATENT DOCUMENTS

| | | | |
|---|---|---|---|
| 7,764,254 B2 * | 7/2010 | Kinugawa et al. ............... 345/87 |
| 8,344,619 B2 * | 1/2013 | Song ............................ 313/506 |
| 2006/0267892 A1 * | 11/2006 | Pei et al. ......................... 345/88 |
| 2007/0013282 A1 * | 1/2007 | Okutani et al. ............... 313/111 |
| 2007/0075627 A1 * | 4/2007 | Kimura et al. ................ 313/503 |
| 2007/0146242 A1 * | 6/2007 | Miller et al. .................... 345/76 |
| 2009/0174638 A1 * | 7/2009 | Brown Elliott et al. ......... 345/88 |
| 2010/0149128 A1 * | 6/2010 | No et al. ....................... 345/174 |

* cited by examiner

*Primary Examiner* — Joseph Haley
*Assistant Examiner* — Emily Frank
(74) *Attorney, Agent, or Firm* — Brinks Gilson & Lione

(57) ABSTRACT

A monochrome light emitting display device and a method for fabricating the same are disclosed, in which a pixel structure of a monochrome light emitting display device is changed to improve a contrast ratio and resolution and at the same time color shift is prevented from occurring, so as to display clearer image. The monochrome light emitting display device comprises a display panel having unit pixels of first and second sub-pixels arranged in a matrix arrangement to display a monochrome image; gate and data drivers respectively driving gate lines and data lines of the display panel; and a timing controller aligning externally input RGB data to be suitable for driving of the display panel to supply the RGB data to the data driver and generating data and gate control signals to control the data and gate drivers.

9 Claims, 12 Drawing Sheets

MONOCHROME LIGHT EMITTING DISPLAY DEVICE AND METHOD FOR FABRICATING THE SAME

This application claims the benefit of Korea Patent Application No. 10-2009-0071760, filed on Aug. 4, 2009, the entire contents of which is incorporated herein by reference for all purposes as if fully set forth herein.

BACKGROUND

1. Field of the Invention

The present disclosure relates to a light emitting display device, and more particularly, to a monochrome light emitting display device and a method for fabricating the same, in which a pixel structure of a monochrome light emitting display device is changed to improve a contrast ratio and resolution and at the same time color shift is prevented from occurring to display clearer image.

2. Discussion of the Related Art

Recently, as image display devices used as monitors for personal computers, personal digital assistants, and various information devices, light weight and thin flat panel display devices are used mostly. Examples of the flat panel display devices include liquid crystal display devices, light emitting display devices, plasma display panels, field emission display devices, and so on.

Of the flat display devices, the light emitting display device has a great contrast ratio owing to use of a light emitting display panel which emits a light for itself, enables fabrication of an super thin display device, and is easy to produce a motion picture owing to a response time period of a few microseconds μs.

Generally, a light emitting display panel for displaying color images includes three sub-pixels for displaying red, green, and blue, as one unit pixel. In this case, red, green or blue color filter is respectively formed in each sub-pixel, whereby a color image is displayed.

Although medical devices, illuminators using surface light sources, guide information display devices and display devices for black-and-white advertisement according to the related art have not been required to display color images, a monochrome light emitting display panel has not been commercially used. For this reason, a mono liquid crystal display device from which red, green and blue color filters are removed has been used.

Particularly, despite the fact that medical devices or guide information display devices should display images of high resolution, high luminance and high picture quality, a liquid crystal display device from which red, green and blue color filters are removed has been used. For this reason, problems have occurred in that a contrast ratio of the liquid crystal display device is deteriorated and color shift is caused.

BRIEF SUMMARY

A monochrome light emitting display device comprises a display panel having unit pixels of first and second sub-pixels arranged in a matrix arrangement to display a monochrome image; gate and data drivers respectively driving gate lines and data lines of the display panel; and a timing controller aligning externally input RGB data to be suitable for driving of the display panel to supply the RGB data to the data driver and generating data and gate control signals to control the data and gate drivers.

In another aspect of the present invention, in a method for fabricating a monochrome light emitting display device that includes a monochrome light emitting display panel, drivers driving the monochrome light emitting display panel, and a timing controller controlling the drivers, the method comprises fabricating the monochrome display panel by arranging unit pixels of first and second sub-pixels in a matrix arrangement to display a monochrome image.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE DRAWINGS AND THE PRESENTLY PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Figure 1:
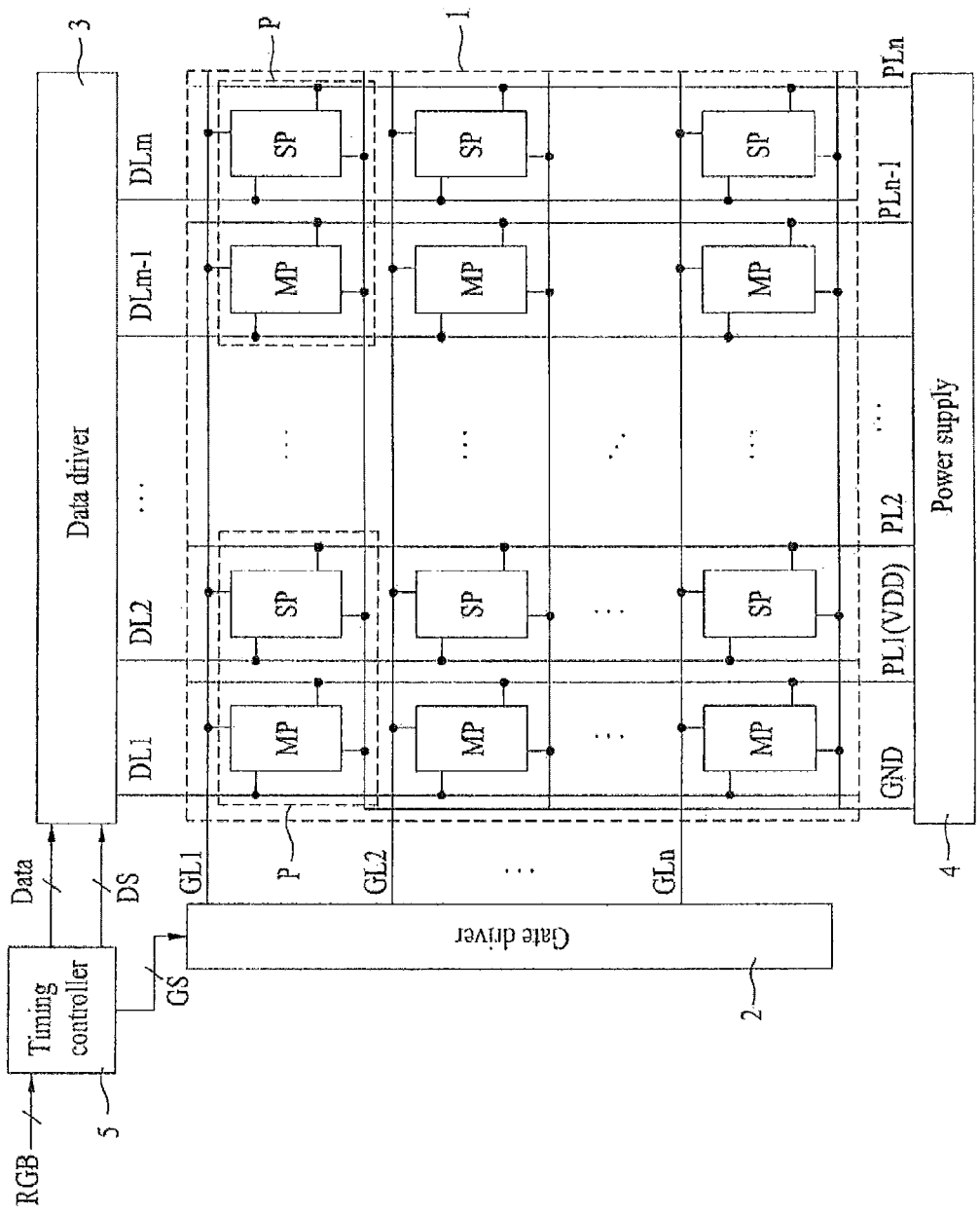
FIG. 1 is a schematic view illustrating a monochrome light emitting display device according to one embodiment of the present invention.
Figure 2:
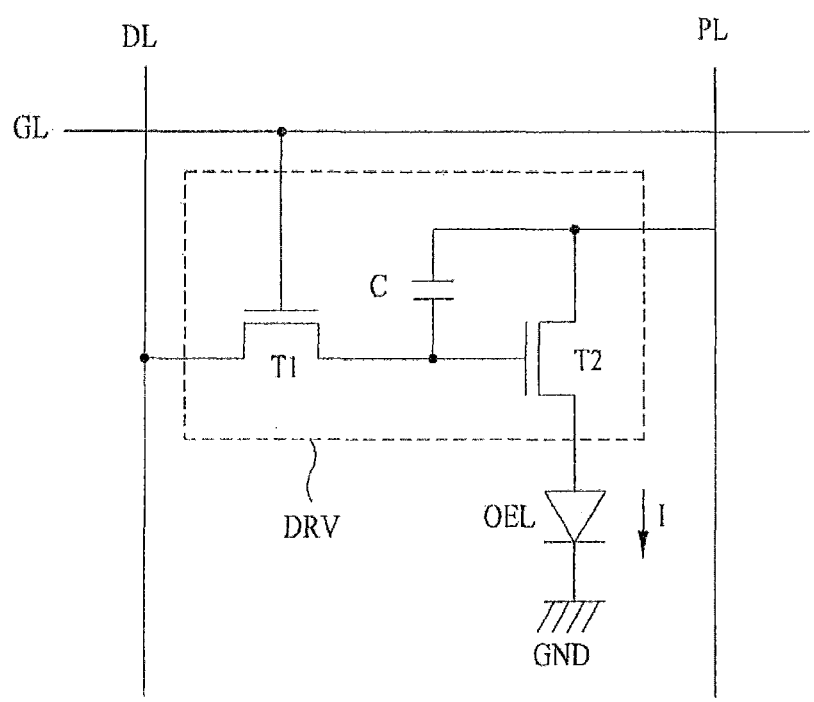
FIG. 2 is an equivalent circuit diagram illustrating a sub-pixel of a monochrome light emitting display device shown in FIG. 1.

FIG. 1 is a schematic view illustrating a monochrome light emitting display device according to one embodiment of the present invention, and FIG. 2 is an equivalent circuit diagram illustrating a sub-pixel of a monochrome light emitting display device shown in FIG. 1.

The monochrome light emitting display device shown in FIG. 1 includes a display panel 1 on which unit pixels P of first and second sub-pixels MP and SP are arranged in a matrix arrangement to display a monochrome image, a gate driver 2 driving gate lines GL1 to GLn of the display panel 1, a data driver 3 driving data lines DL1 to DLm of the display panel 1, a power supply 4 applying first and second power signals VDD and GND to power lines PLn to PLm of the display panel 1, and a timing controller 5 aligning externally input RGB data in a size and resolution suitable for the display panel 1 to supply the RGB data to the data driver 3 and generating data and gate control signals DS and GS to control the data and gate drivers 3 and 2.

The display panel 1 includes a master sub-pixel (MP) and a slave sub-pixel (SP), i.e., first and second sub-pixels (MP and SP), as one unit pixel P. These unit pixels P are arranged in a matrix arrangement to display a monochrome image. In this case, the first and second sub-pixels MP and SP respectively include a light emitting cell OES and a cell driver DRV independently driving the light emitting cells. In other words, as shown in FIG. 2, each of the first and second sub-pixels MP and SP includes a cell driver DRV connected to a gate line GL, a data line DL, and a power line PL, and a light emitting cell OES connected between the cell driver DRV and a second power signal GND so as to be expressed as a diode equivalently.

The cell driver DRV includes a first switching device T1 connected to the gate line GL and the data line DL, a second switching device T2 connected to the first switching device T1, the power line PL, and the light emitting cell OES, and a storage capacitor C connected between the power line PL and the first switching device T1.

The first switching device T1 includes a gate electrode connected to the gate line GL, a source electrode connected to the data line DL, and a drain electrode connected to a gate electrode of the second switching device T2. The first switching device T1 is turned on upon reception of a gate on signal at the gate line GL to supply a data signal received at the data line DL to the storage capacitor C and the gate electrode of the second switching device T2.

The second switching device T2 includes a source electrode connected to the power line PL, and a drain electrode connected to the light emitting cell OES. The second switching device T2 controls a current I supplied from the power line PL to the light emitting cell OES in response to the data signal from the first switching device, thereby controlling a light emitting quantity from the light emitting cell OES.

The storage capacitor C is connected between the power line PL and the gate electrode of the second switching device T2. The second switching device T2 maintains a turn on state owing to a voltage charged at the storage capacitor C even if the first switching device T1 is turned off, to maintain light emission from the light emitting cell OES until the data signal of next frame is received. In this case, although PMOS or NMOS transistors may be used as the first and second switching devices T1 and T2, only a case where the NMOS transistors are used will be described.

The gate driver 2 of FIG. 1 sequentially generates gate-on signals in response to gate control signals GCS from the timing controller 8, such as a gate start pulse GSP and a gate shift clock GSC, and controls pulse widths of the gate-on signals in response to a gate output enable GOE signal. Then, the gate driver 2 sequentially supplies the gate-on signals to the gate lines GL1 to GLn. In this case, a gate- off voltage is supplied to the gate lines GL1 to GLn for a time period when a gate-on voltage is not supplied thereto.

The data driver 3 converts extended RGB data input from the timing controller 5 into an analog voltage, i.e., an analog image signal by using a source start pulse SSP, a source shift clock SSC, and so on of the data control signals DCS. Then, the data driver 3 supplies the image signal to each of the data lines DL1 to DLm in response to the source output enable (SOE) signal. In detail, the data driver 3 latches the extended RGB data received in response to the source shift clock SSC of the data control signal DCS, and supplies an image signal of one horizontal line portion to the data lines DL1~DLm in every one horizontal period in which the scan pulse is supplied to the gate lines GL1~GLn in response to the source enable SOE signal.

The power supply 4 supplies the first power signal VDD and the second power signal GND to the display panel 1. In this case, the first power signal VDD means a driving voltage for driving the light emitting cell OES, and the second power signal GND means a ground voltage or low voltage. A current corresponding to an image signal may flow in each of the first and second sub-pixels MP and SP due to the difference between the first power signal VDD and the second power signal GND.

The timing controller 8 aligns the external RGB data to be suitable for a size and resolution of the display panel 1, and supplies the aligned RGB data to the data driver 3. The timing controller 5 generates the gate control signal GS and the data signal DS by using external synchronizing signals and supplies them to the gate driver 2 and the data driver 3.

Figure 3A:
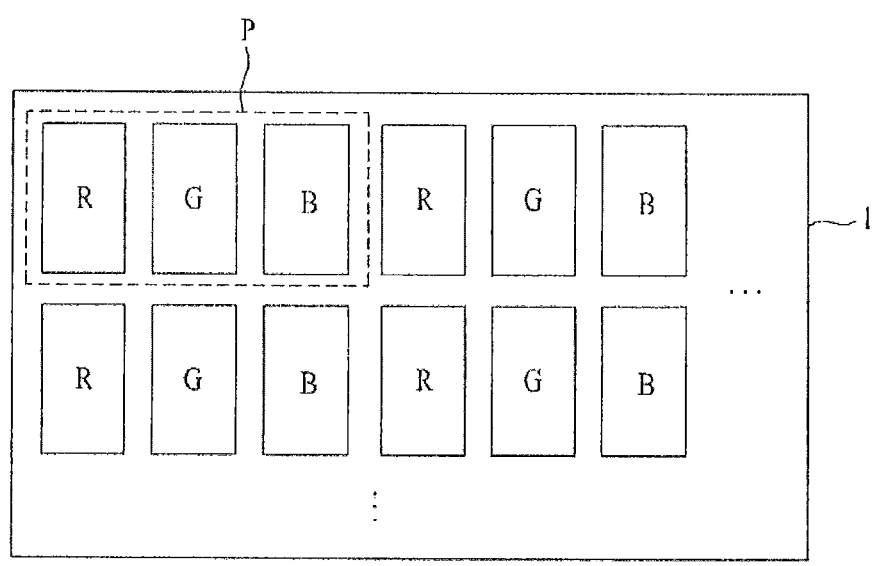
FIG. 3A and FIG. 3B are schematic views illustrating a light emitting display panel according to the related art and a light emitting display panel according to the embodiment of the present invention.
Figure 3B:
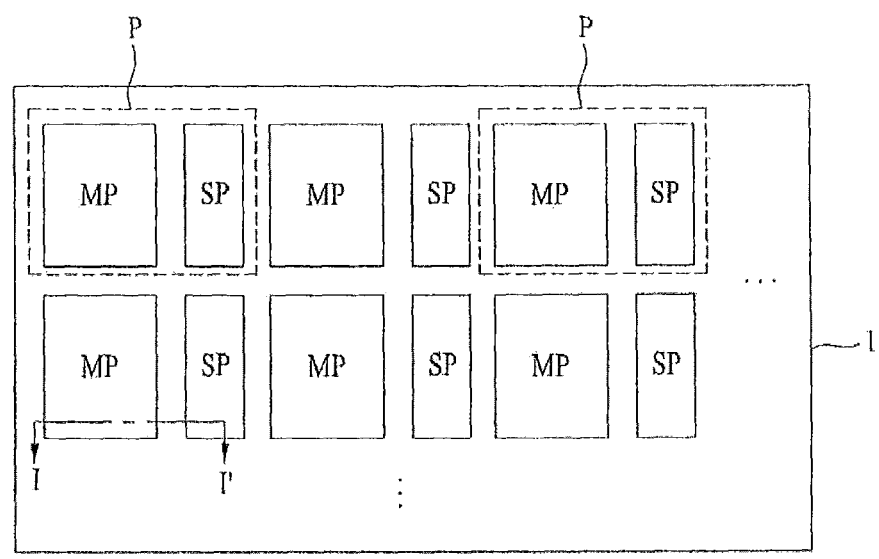

FIG. 3A and FIG. 3B are schematic views illustrating a light emitting display panel according to the related art and a light emitting display panel according to the embodiment of the present invention.

The light emitting display panel according to the related art shown in FIG. 3A includes vertical stripe type red, green and blue sub-pixels R, G, B to constitute one unit pixel P. This light emitting display panel displays a monochrome image, i.e., white or gray image by using combination of red, green and blue. Also, unlike such color combination, red, green and blue color filters constituting red, green and blue sub-pixels may be removed to display white or gray image. Since red, green and blue sub-pixels constitute one unit pixel P in the display panel according to the related art, an area constituting each sub-pixel R, G, B, i.e., a size of each sub-pixel R, G, B is reduced. Also, the number of data lines DL1 to DLm for driving each sub-pixel R, G, B is increased depending on the number of sub-pixels R, G, B.

However, the light emitting display panel according to the present invention shown in FIG. 3B includes vertical stripe type first and second sub-pixels MP and SP to constitute one unit pixel P. The first and second sub-pixels MP and SP are not provided with color filter, and may have the same size or may be formed in a different size.

In FIG. 3B, the first sub-pixel MP is twice greater than the second sub-pixel SP. In this way, if the first sub-pixel MP is different from the second sub-pixel SP in size, light emitting luminance of the first sub-pixel MP may be different from that of the second sub-pixel SP. In other words, optical brightness may be varied depending on the sizes of the first and second sub-pixels MP and SP. For example, if the first sub-pixel is twice greater than the second sub-pixel to be complementary to each other, color shift occurs, if any, in opposite colors complementary to each other, whereby the first and second sub-pixels can display their own brightness. In other words, if brightness of the first sub-pixel MP is changed toward red, the second sub-pixel is changed toward blue depending on the difference of area unlike the first sub-pixel MP, whereby one unit pixel P can display a desired brightness. Also, as shown in FIG. 3B, if one unit pixel P is formed by the first and second sub-pixels MP and SP only, an area of each unit pixel P can be reduced to ⅔ as compared with the unit pixel according to the related art. Accordingly, if the display panel 1 according to the present invention is fabricated in the same size as that of the related art, it can obtain resolution ⅓ higher than the related art.

Figure 4:
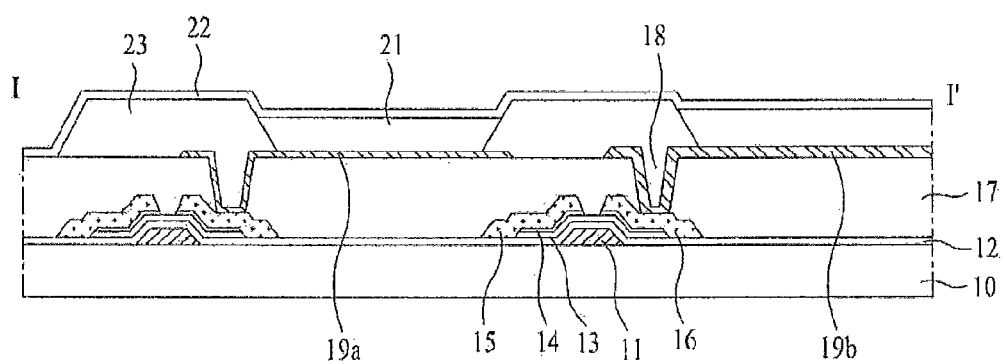
FIG. 4 is a process sectional view illustrating a region I-I' shown in FIG. 3B.

FIG. 4 is a process sectional view illustrating a region I-I' shown in FIG. 3B.

As shown in FIG. 4, each unit pixel P provided in the display panel 1 of the present invention includes first and second sub-pixels MP and SP adjacent to each other, wherein each sub-pixel MP and SP includes a cell driver DRV of a TFT and light emitting cells OES of a diode type. The cell driver DRV and the light emitting cells OES may be formed on a lower substrate 10. In this case, an encapsulation substrate, i.e., upper substrate, for encapsulating the cell driver DRV and the light emitting cells OES is further formed on the lower substrate 10.

Switching devices formed in the sub-pixels MP and SP may have a bottom gate structure of amorphous silicon a-Si, and, although not shown, each of the switching devices may also have a top gate structure of a polysilicon. The lower substrate 10 of a display region 1a will be described in more detail.

The lower substrate 10 includes a gate electrode 11 formed at a non-light emitting region, a gate insulating film 12 formed on an entire surface of the lower substrate 10 including the gate electrode 11, a semiconductor layer 13 formed on the gate insulating film 12 to be overlapped with the gate electrode 11, ohmic contact layers 14 formed overlapped with opposite edges of the semiconductor layer 13 respectively, source/drain electrodes 15 and 16 formed on the ohmic contact layers 14, and a protective film 17 formed on the entire surface of the lower substrate 10 including the source/drain electrodes 15 and 16. The gate electrode 11, the source/drain electrodes 15 and 16, the semiconductor layer 13, the ohmic contact layers 14, the gate insulating film 12, and the protective film 17 form one switching device.

The protective film 17 has a contact hole 18 passing through the protective film 17 at each sub-pixel region to partially expose the drain electrode 16, and each of the contact hole 18 is provided with first electrodes 19a and 19b to electrically contact the drain electrode. The lower substrate 10 further includes a pixel defining layer 23 formed at the non-light emitting region including the contact hole 18, an organic light emitting layer 21 formed on a surface of the first electrode 19 at the light emitting region, and a second electrode 22 formed on the entire surface of the lower substrate 10 including the organic light emitting layer 21. The first electrode 19, the organic light emitting layer 21, the second electrode 22 form one light emitting cell OES.

As described above, each of the first and second sub-pixels MP and SP constituting one unit pixel P includes at least one switching device and at least one light emitting cell OES. The first electrodes 19a and 19b formed in the light emitting cells of the first and second sub-pixels MP and SP and electrically connected with each switching device may have the same thickness or different thicknesses. In other words, the thickness of the first electrode 19a of the light emitting cell OES formed in the first sub-pixel MP may be the same as or different from that of the first electrode 19b of the light emitting cell OES formed in the second sub-pixel SP. In FIG. 4, the first electrode 19b of the light emitting cell OES formed in the second sub-pixel SP is twice thicker than that of the first electrode 19a of the light emitting cell OES formed in the first sub-pixel MP. In this way, each of the first electrodes 19a and 19b is connected to the drain electrode 16 of each switching device through the contact hole 18 and then supplied to each light emitting cell OES in accordance with the image signal input through each drain electrode 16.

If the first electrodes 19a and 19b of the first sub-pixel MP and the second sub-pixel SP are formed at different thicknesses, light emitting luminance in the light emitting cell OES of the first sub-pixel MP may be different from that of the second sub-pixel SP. In other words, optical brightness may be varied depending on the thicknesses of the first electrodes 19a and 19b. For example, if the first electrode 19a of the first sub-pixel MP is twice greater than the first electrode 19b of the second sub-pixel SP to be complementary to each other, color shift occurs, if any, in opposite colors complementary to each other, whereby the first and second sub-pixels can display their own brightness. In other words, if brightness of the first sub-pixel MP is changed toward red depending on the thickness of the first electrode 19a, the second sub-pixel SP is changed toward blue depending on the difference in thickness of the first electrode 19b, whereby one unit pixel P can display a desired brightness.

The first electrode 19a of the first sub-pixel MP and the first electrode 19b of the second sub-pixel SP are formed on the entire surface of the light emitting regions including the contact hole 18 in each of the sub-pixel regions MP and SP. Each of the first electrodes 19a and 19b may serve as an anode or cathode, and is formed of at least one of transparent conductive materials selected from ITO (Indium Tin Oxide), IZO (Indium Zinc Oxide), AZO (Al-doped Zinc Oxide) if it is intended to have a lower side light emission. The ITO is a transparent conductive film with a comparatively uniform work function to have a low hole injection barrier against the organic light emitting layer 21. Opposite to this, each of the first electrodes 19a and 19b may be formed of at least one of metals selected from ITO/Ag, ITO/Ag/ITO, ITO/Ag/IZO (Indium Zinc Oxide), aluminum Al, aluminum alloy AlNd, copper Cu, silver Ag, and copper alloy, if it is intended to have an upper side light emission. Hereinafter, a method for fabricating the first and second sub-pixels MP and SP will be described in more detail with reference to the accompanying drawings.

In the meantime, although not shown, a power line PL is formed on a gate insulating film located in a non-display region 1b outside the lower substrate 10. The power line PL is a line that transmits a first power signal or a second power signal, wherein the first power signal or the second power signal means a power source applied to a first or second electrode 19a, 19b or 22 of the light emitting cells OES. The power line PL is formed of the same material as that of the source/drain electrodes 15 and 16. In other words, the power line PL and the source/drain electrodes 15 and 16 can simultaneously be fabricated through the same mask process. The power line PL is electrically connected to the first or second electrode 19a, 19b or 22 of the light emitting cells OES through a pad electrode which is not shown. Accordingly, the protective film 19 may further provided with contact holes connected to the power line PL in addition to the contact hole 18 connected to the drain electrode 16.

The pixel defining layer 23 is a barrier surrounding each of the sub-pixels at the non-light emitting region to improve an aperture ratio of the light emitting region, and may be formed to correspond to each position of the switching devices. The pixel defining layer 23 defines boundaries between the light emitting cells OES at the light emitting regions clearly to make light emitting boundary regions between the light emitting regions clear. The pixel defining layer 23 includes a slope surface formed at the first electrodes 19a and 19b. The slope surface may have an angle from the first electrodes 19a and 19b, i.e., an angle of taper, of 10~20 degrees. The pixel defining layer 23 may be formed of an insulating material of oxide silicon SiOx, nitride silicon SiNx, photoacryl, benzocyclobutene BCB coated and patterned. Likewise, since an insulating pattern 28 can be formed simultaneously with the pixel defining layer 23, a material for forming the insulating pattern 28 may be the same as that for forming the pixel defining layer 23.

The organic light emitting layer 21 includes a hole injection layer HIL, a hole transporting layer HTL, a light emitting layer OEL, an electron injection layer EIL, and an electron transporting layer ETL. The hole injection layer HIL is formed on an oxide thin film (not shown) formed on the surface of the first electrode 19, and the hole transporting layer HTL is formed on an entire surface of an upper side of the hole injection layer HIL. The light emitting layer OEL is formed on the hole transporting layer HTL at the light emitting region, and the electron injection layer EIL is formed on an entire surface of an upper side of the light emitting layer OEL. The electron transporting layer ETL is formed on an upper surface of the electron injection layer EIL.

The hole injection layer HIL, the hole transporting layer HTL, the light emitting layer OEL, the electron injection layer EIL, and the electron transporting layer ETL, which constitute the organic light emitting layer 21, may have the same thickness or different thicknesses.

The second electrode 22 is formed to cover the entire surface of the lower substrate 10 including the pixel defining layer 23 and the organic light emitting layer 21. The second electrode 22 may serve as an anode or cathode electrode, and is formed of at least one of Al, AlNd, Cu, copper alloy, ITO, ITO/Ag/ITO, ITO/Ag/IZO(Indium Zinc Oxide), and their equivalents, which have a comparatively low work function, if it is intended to have a lower side light emission. Opposite to this, the second electrodes 22 is formed of at least one of transparent conductive materials selected from ITO, IZO, and AZO, if it is intended to have an upper side light emission.

Figure 5A:
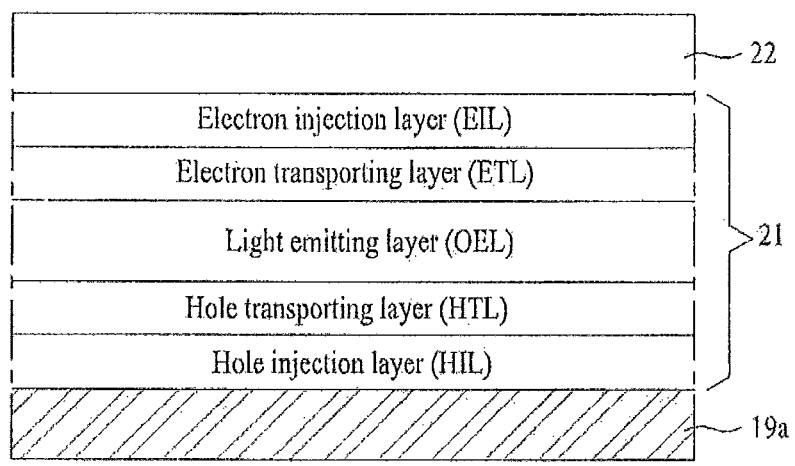
FIG. 5A and FIG. 5B are process sectional views illustrating a method for fabricating a display panel shown in FIG. 1 and FIG. 4.
Figure 5B:
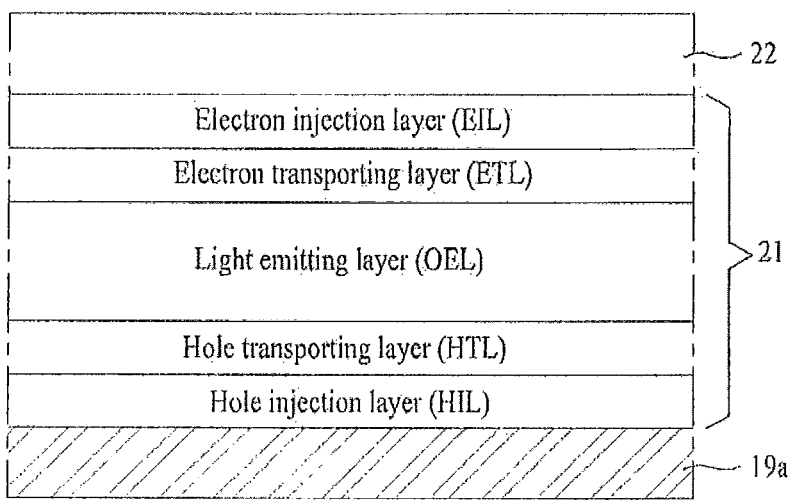

FIG. 5A and FIG. 5B are schematic views illustrating light emitting cells of first and second sub-pixels.

As described above, each of each of the first and second sub-pixels MP and SP constituting one unit pixel P according to the present invention includes at least one switching device and at least one light emitting cell OES. The light emitting cells of the first and second sub-pixels MP and SP may have the same thickness or may be formed at different thicknesses. In other words, the thickness of the light emitting cell OES formed in the first sub-pixel MP may be the same as or different from that of the light emitting cell OES formed in the second sub-pixel SP.

FIG. 5A illustrates a sectional view of the light emitting cell OES formed in the first sub-pixel MP. The light emitting cell OES having a sectional structure of FIG. 5A may be formed at the first and second sub-pixels MP and SP with the same thickness.

However, as shown in FIG. 5B, the light emitting cell OES may be formed in any one of the first and second sub-pixels MP and SP at a different thickness. Particularly, the organic light emitting layer 21 constituting the light emitting cell OES may have a different thickness. In FIG. 5B, in the hole injection layer HIL, the hole transporting layer HTL, the light emitting layer OEL, the electron injection layer EIL, and the electron transporting layer ETL, which constitute the organic light emitting layer 21, the light emitting layer OEL is 0.5 times thicker than that of FIG. 5A.

As described above, if the light emitting layer 21 of the first sub-pixel MP is formed at a thickness different from that of the second sub-pixel SP, light emitting luminance in the light emitting cell OES of the first sub-pixel MP may be different from that of the second sub-pixel SP. In other words, optical brightness may be varied depending on the thicknesses of the light emitting layer 21. For example, if the light emitting layer 21 of the first sub-pixel MP is formed at a thickness 0.5 times or twice greater than that of the second sub-pixel SP to be complementary to each other, color shift occurs, if any, in opposite colors complementary to each other, whereby the first and second sub-pixels can display their own brightness. In other words, if brightness of the first sub-pixel MP is changed toward red depending on the thickness of the light emitting layer 21, the second sub-pixel SP is changed toward blue depending on the difference in thickness of the light emitting layer 21, whereby one unit pixel P can display a desired brightness.

Figure 6A:
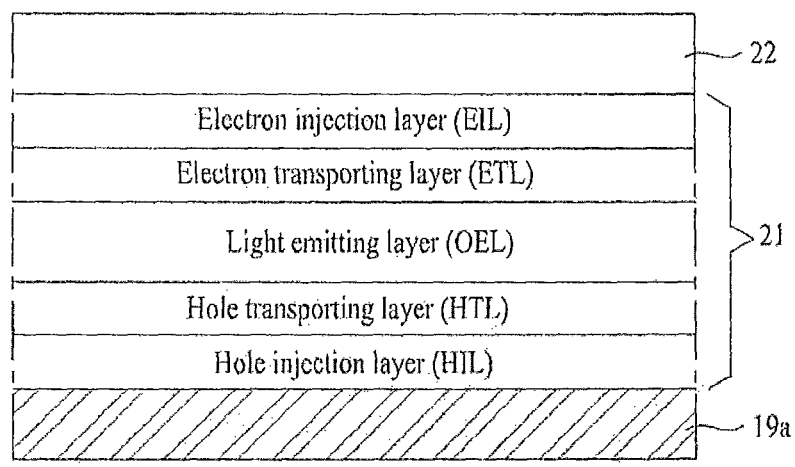
FIG. 6 is a schematic view illustrating a monochrome light emitting display device according to another embodiment of the present invention.
Figure 6B:
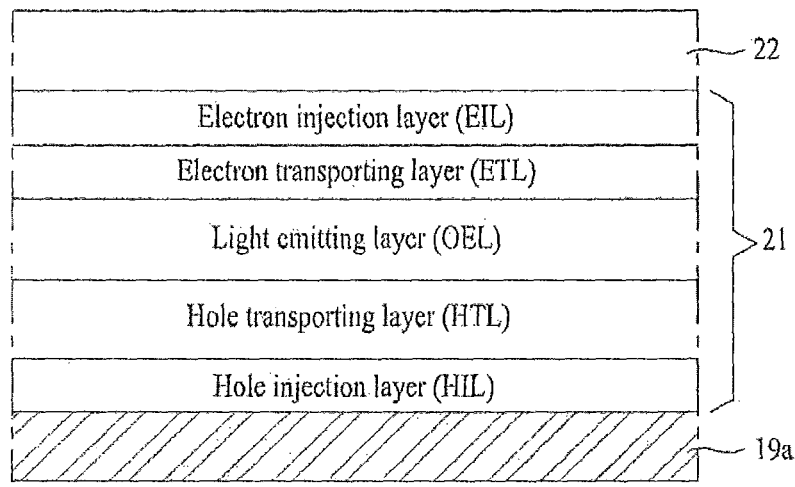

FIG. 6A and FIG. 6B are another schematic views illustrating light emitting cells of first and second sub-pixels.

FIG. 6A illustrates a sectional view of the light emitting cell OES formed in the first sub-pixel MP. As shown in FIG. 5A and FIG. 6A, the light emitting cell OES may be formed at the first and second sub-pixels MP and SP with the same thickness.

However, as shown in FIG. 6B, the light emitting cell OES may be formed in any one of the first and second sub-pixels MP and SP at a different thickness. Particularly, the organic light emitting layer 21 constituting the light emitting cell OES may have a different thickness. In FIG. 6B, in the hole injection layer HIL, the hole transporting layer HTL, the light emitting layer OEL, the electron injection layer EIL, and the electron transporting layer ETL, which constitute the organic light emitting layer 21, the hole transporting layer HTL is 0.5 times thicker than that of FIG. 6A.

As described above, if the light emitting layer 21 of the first sub-pixel MP is formed at a thickness different from that of the second sub-pixel SP, light emitting luminance in the light emitting cell OES of the first sub-pixel MP may be different from that of the second sub-pixel SP. In other words, optical brightness may be varied depending on the thicknesses of the light emitting layer 21. For example, if the light emitting layer 21 of the first sub-pixel MP is formed at a thickness 0.5 times or twice greater than that of the second sub-pixel SP to be complementary to each other, color shift occurs, if any, in opposite colors complementary to each other, whereby the first and second sub-pixels can display their own brightness.

FIG. 7A to FIG. 7D are process sectional views illustrating a method for fabricating a display panel shown in FIG. 1 and FIG. 4.

A method for fabricating a display panel according to the embodiment of the present invention will be described in more detail with reference to FIG. 7A to FIG. 7D.

Figure 7A:
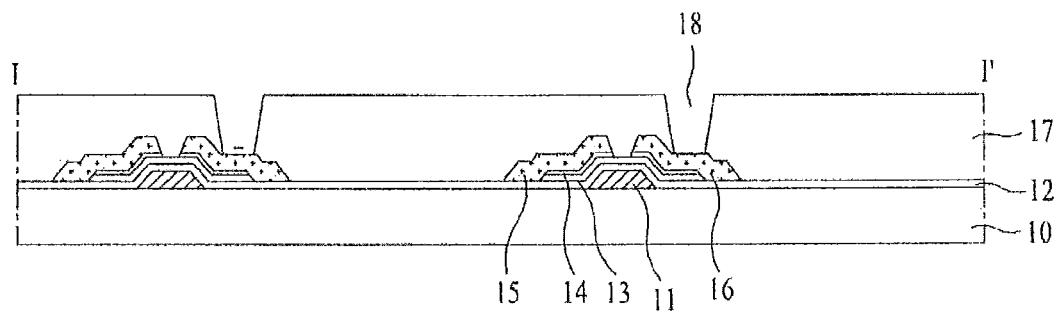
FIG. 7A to FIG. 7D are process sectional views illustrating a method for fabricating a display panel shown in FIG. 1 and FIG. 4.

Referring to FIG. 7A, a gate metal material is deposited on a glass substrate which is used as a lower substrate 10, and then patterned to form a gate electrode 11. Then, a gate insulating film 12 is deposited on an entire surface of the lower substrate 10 including the gate electrode 11, and a semiconductor layer forming material, an ohmic contact layer forming material, and a source/drain forming material are sequentially deposited on the gate insulating film 12.

Afterwards, the semiconductor layer forming material, the ohmic contact layer forming material, and the source/drain forming material are patterned simultaneously or sequentially to form a switching device that includes a semiconductor layer 13, an ohmic contact layer 14, and source/drain electrodes 15 and 16. Then, a protective film 17 is formed on the entire surface of the lower substrate 10 including the switching device and the gate insulating film 12, and then patterned to form a contact hole 18 that exposes a predetermined region of the drain electrode 16 of the switching device.

Figure 7B:
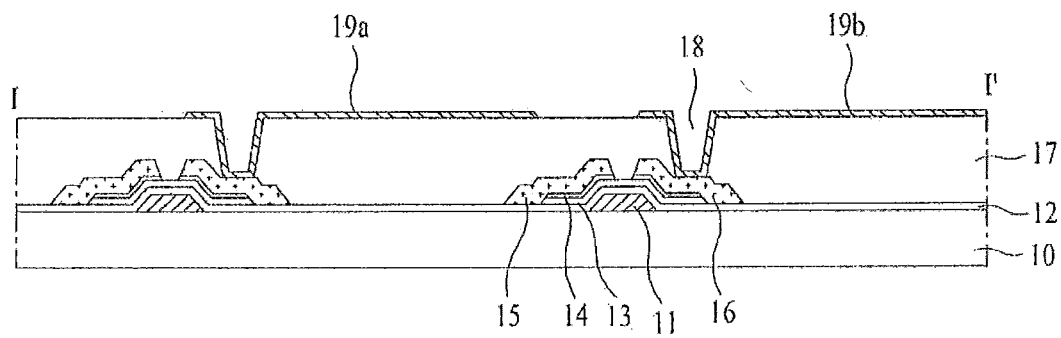

Next, referring to FIG. 7B, ITO, IZO, AZO, or a material equivalent thereto, i.e., first electrode forming material is deposited on the lower substrate 10 by PPECVD (Plasma Enhanced Chemical Vapor Deposition) or sputtering, and then patterned to form first electrodes 19a and 19b. The first electrode 19 is electrically connected with the drain electrode 16 of the switching device through the contact hole 18.

Figure 7C:
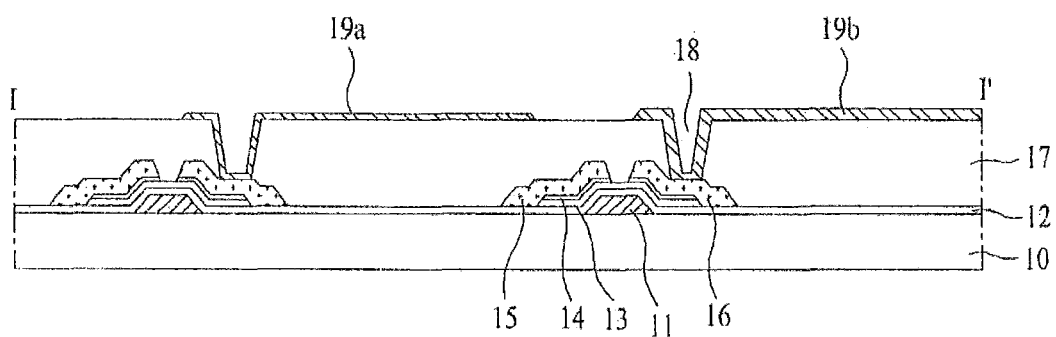

Afterwards, referring to FIG. 7C, the first electrode forming material is secondarily deposited on the lower substrate 10 on which the first electrodes 19a and 19b are primarily formed. The first electrode 19a of the first sub-pixel MP and the first electrode 19b of the second sub-pixel SP are patterned differently from each other to have different thicknesses.

Although the first electrode 19a of the first sub-pixel MP and the first electrode 19b of the second sub-pixel SP have been formed at different thicknesses by repeating deposition and patterning processes, after the first electrode forming materials are deposited at the same thickness, the patterning process may separately be performed for the first electrode 19a of the first sub-pixel MP and the first electrode 19b of the second sub-pixel SP to have different thicknesses.

Figure 7D:
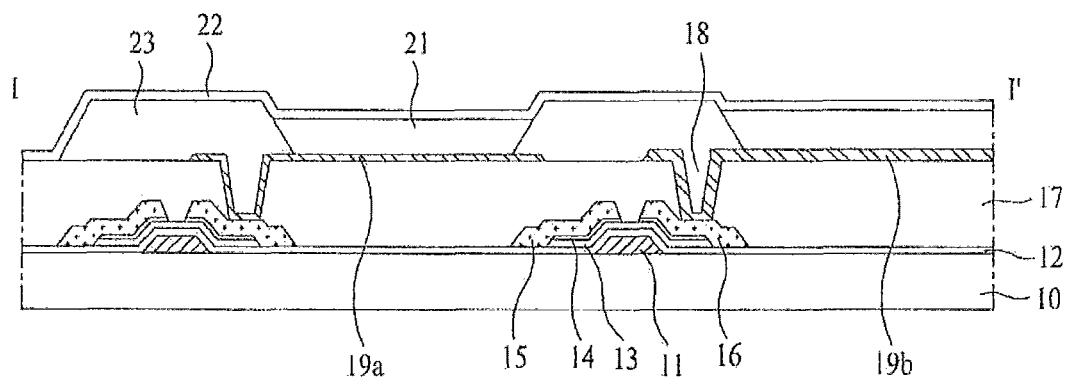

Next, referring to FIG. 7D, an insulating material, such as oxide silicon SiOx, nitride silicon SiNx, photo acryl, and benzocyclobutene BCB is deposited on the entire surface of the lower substrate 10 having the first electrodes 19a and 19b formed thereon by PECVD, spin coating, or spinless coating, and then patterned to form a pixel defining layer 23 to correspond to the non-light emitting region having the switching device formed therein.

Afterwards, an organic light emitting layer 21 is formed on the entire surface of the first electrodes 19a and 19b of the light emitting region by printing, a shadow mask method, or laser induced thermal imaging, wherein the first electrodes 19a and 19b are formed at different thicknesses. That is, although not shown in detail, the organic light emitting layer 21 is formed by depositing a hole injection layer HIL, a hole transporting layer HTL, a light emitting layer OEL, an electron injection layer EIL, and an electron transporting layer ETL in due order by the shadow mask method, the laser induced thermal imaging, or so on.

Then, a second electrode 22 is formed on the entire surface of the lower substrate 10 having the organic light emitting layer 21 formed thereon by PECVD or sputtering. In this case, the second electrode 22 has a stack structure of at least one of metals selected from aluminum Al, an aluminum alloy AlNd, copper Cu, and a copper alloy which have a comparatively low work function and silver/calcium Ag/Ca. The second electrode 22 is formed to cover the entire surface of the organic light emitting layer 21 including the pixel defining layer 23.

Next, although not shown, after a sealant is formed in the non-display region of the upper or lower substrate 10, the upper and lower substrates 10 are bonded to each other to complete a monochrome light emitting display panel.

As described above, in the light emitting display device according to the embodiment of the present invention, each unit pixel P of the monochrome light emitting display panel 1 includes first and second sub-pixels MP and SP only, wherein the first and second sub-pixels MP and SP may be formed at the same thickness or different thicknesses. Also, as the electrodes 19a and 19b and the organic light emitting layer 21, which constitute the light emitting cell OES of the first and second sub-pixels MP and SP, are formed at the same thickness or different thicknesses, a contrast ratio or resolution of the displayed image can be improved, and color shift can be prevented from occurring, so as to display clearer image.

Figure 8:
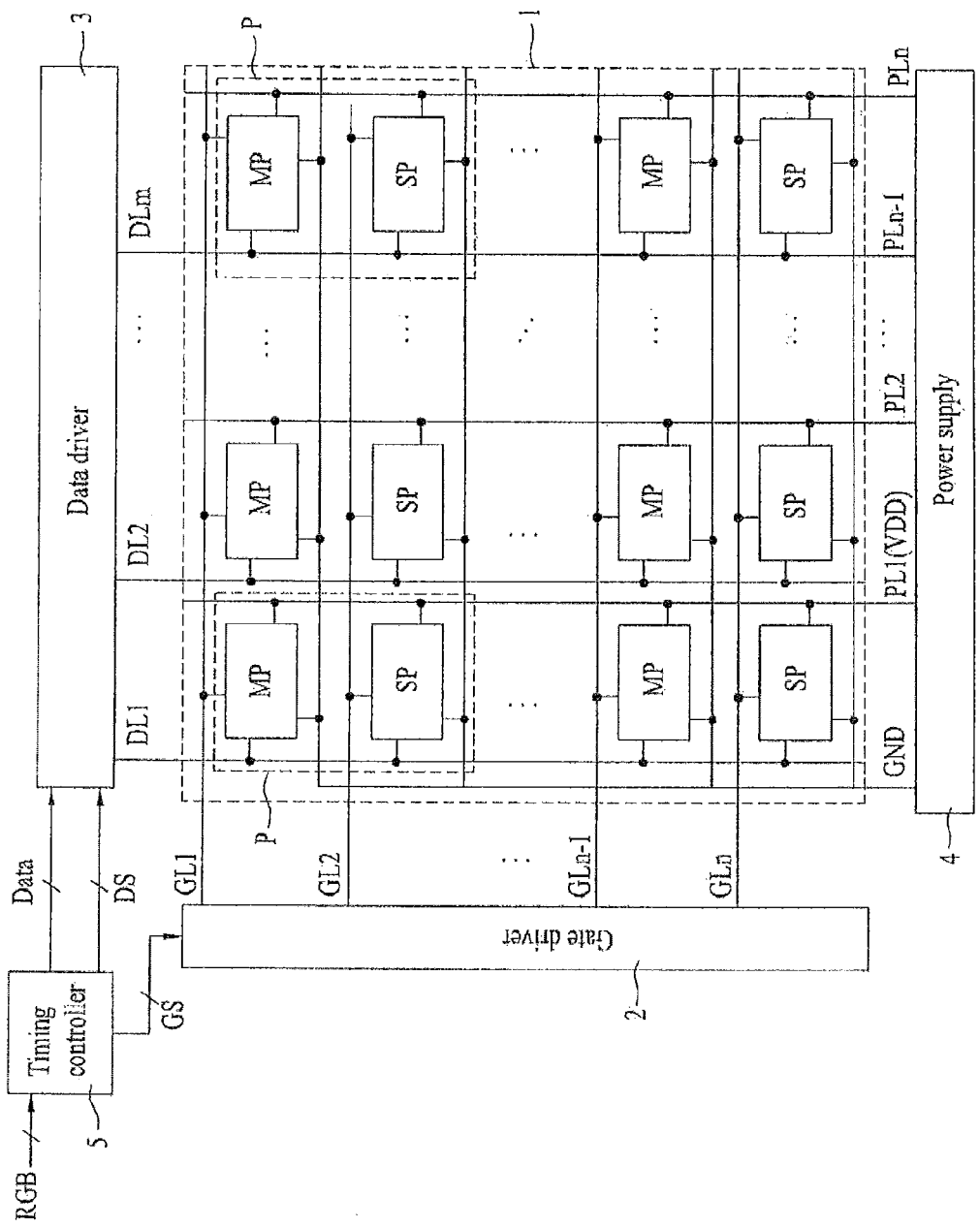
FIG. 8 is a schematic view illustrating a monochrome light emitting display device according to other embodiment of the present invention.
Figure 9A:
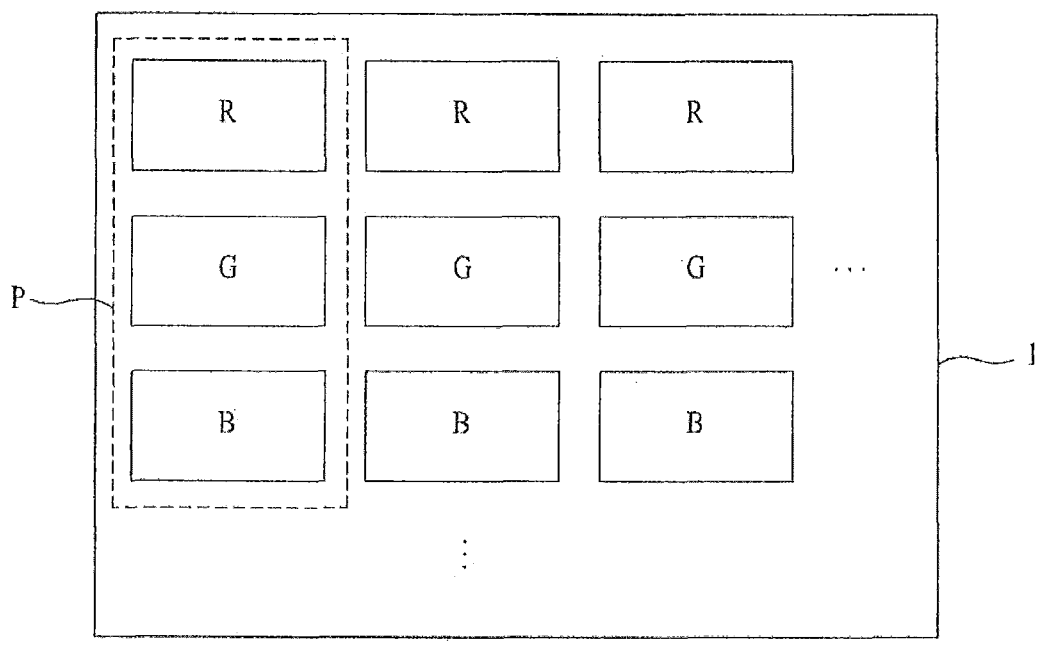
FIG. 9A and FIG. 9B are schematic views illustrating a light emitting display panel according to the related art and a light emitting display panel shown in FIG. 6.
Figure 9B:
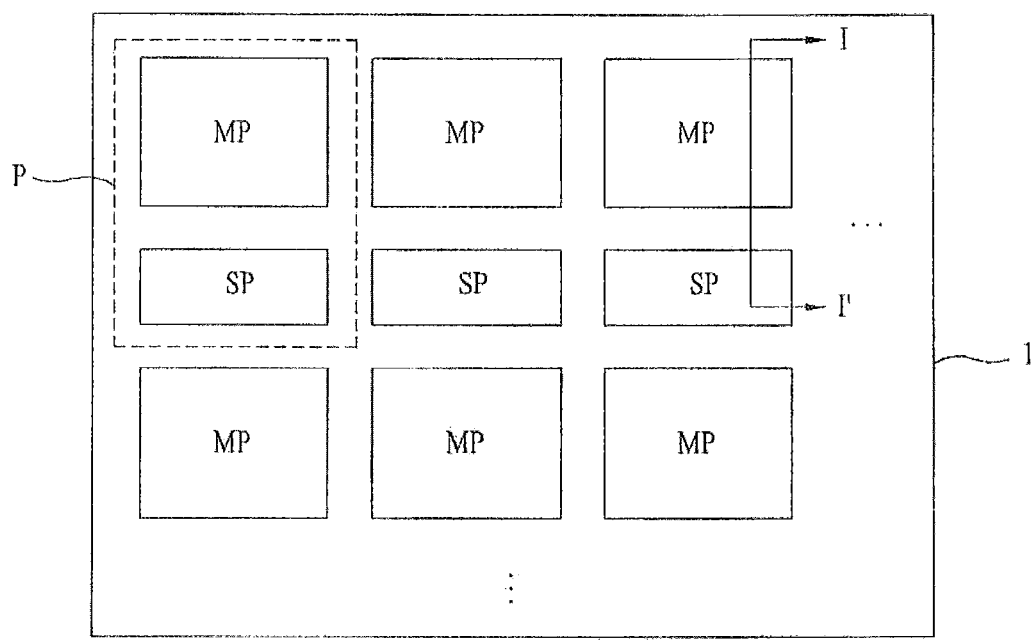

FIG. 8 is a schematic view illustrating a monochrome light emitting display device according to other embodiment of the present invention, and FIG. 9A and FIG. 9B are schematic views illustrating a light emitting display panel according to the related art and a light emitting display panel shown in FIG. 6.

In a display panel 1 of a monochrome light emitting display device shown in FIG. 8 and FIG. 9b, first and second sub-pixels MP and SP constitute one unit pixel, and a plurality of unit pixels P are arranged in a horizontal stripe arrangement to display a monochrome image, i.e., gray image. In other words, the first and second sub-pixels MP and SP constituting one unit pixel are longitudinally arranged in parallel along a gate line GL, whereby the first and second sub-pixels constituting each unit pixel P are connected to each of data lines DL1 to DLm. Accordingly, in the display panel 1 according to other embodiment of the present invention, the number of gate lines GL1 to GLm increase as compared with the display panel 1 shown in FIG. 1 but the number of data lines DL1 to DLm is reduced to ⅓. As a result, the number of data drive ICs (not shown) constituting the data driver 3 can be reduced to ⅓. In this case, the data driver 3 and the gate driver 2 supply data signals to the first and second sub-pixels MP and SP of each unit pixel P through a time-division driving method.

In addition to the aforementioned display panel 1 according to other embodiment of the present invention, the other elements, i.e., the gate driver 2, the data driver 3, the power supply 4 and the timing controller 4, and their driving method will be replaced with the detailed description of FIG. 1.

FIG. 9A illustrates a structure of a horizontal stripe type display panel according to the related art.

The light emitting display panel according to the related art includes red, green and blue sub-pixels R, G, B to constitute one unit pixel P. This light emitting display panel displays a monochrome image or gray image by using combination of red, green and blue, in the same manner as that shown in FIG. 3A. However, the monochrome light emitting display panel 1 shown in FIG. 7b may have a horizontal stripe arrangement so that the first and second sub-pixels constitute one unit pixel. The first and second sub-pixels MP and SP may be formed at the same size or different sizes.

In FIG. 9B, the first sub-pixel MP is twice greater than the second sub-pixel SP. In this way, if the first sub-pixel MP is different from the second sub-pixel SP in size, light emitting luminance of the first sub-pixel MP may be different from that of the second sub-pixel SP. In other words, optical brightness may be varied depending on the sizes of the first and second sub-pixels MP and SP. For example, if the first sub-pixel is twice greater than the second sub-pixel to be complementary to each other, color shift occurs, if any, in opposite colors complementary to each other, whereby the first and second sub-pixels can display their own brightness. Also, as shown in FIG. 9B, if one unit pixel P is formed by the first and second sub-pixels MP and SP only, an area of each unit pixel P can be reduced to ⅔ as compared with the unit pixel according to the related art. Accordingly, if the display panel 1 according to the present invention is fabricated in the same size as that of the related art, it can obtain resolution ⅓ higher than the related art.

In the meantime, each of the first and second sub-pixels MP and SP constituting one unit pixel P includes at least one switching device and at least one light emitting cell OES. The first electrodes 19a and 19b formed in the light emitting cells of the first and second sub-pixels MP and SP and electrically connected with each switching device may have the same thickness or may be formed in a different thickness. In other words, the thickness of the first electrode 19a of the light emitting cell OES formed in the first sub-pixel MP may be the same as or different from that of the first electrode 19b of the light emitting cell OES formed in the second sub-pixel SP. Also, the thickness of the organic light emitting layer 21 of the light emitting cell OES formed in the first sub-pixel MP may be the same as or different from that of the organic light emitting layer 21 of the light emitting cell OES formed in the second sub-pixel SP.

A section of I-I' in FIG. 9B may be identical with FIG. 4. In FIG. 4, the first electrode 19b of the light emitting cell OES formed in the second sub-pixel SP is twice thicker than that of the first electrode 19a of the light emitting cell OES formed in the first sub-pixel MP. In this way, each of the first electrodes 19a and 19b is connected to the drain electrode 16 of each switching device through the contact hole 18 and then supplied to each light emitting cell OES in accordance with the image signal input through each drain electrode 16. Accordingly, if the first electrodes 19a and 19b of the first sub-pixel MP and the second sub-pixel SP are formed at different thicknesses, light emitting luminance in the light emitting cell OES of the first sub-pixel MP may be different from that of the second sub-pixel SP. In other words, optical brightness may be varied depending on the thicknesses of the first electrodes 19a and 19b. For example, if the first electrode 19a of the first sub-pixel MP is twice greater than the first electrode 19b of the second sub-pixel SP to be complementary to each other, color shift occurs, if any, in opposite colors complementary to each other, whereby the first and second sub-pixels can display their own brightness.

As described above, in the light emitting display device according to the embodiment of the present invention, each unit pixel P of the monochrome light emitting display panel 1 includes first and second sub-pixels MP and SP only, wherein the first and second sub-pixels MP and SP may be formed at the same thickness or different thicknesses. Also, as the electrodes 19a and 19b and the organic light emitting layer 21, which constitute the light emitting cell OES of the first and second sub-pixels MP and SP, are formed at the same thickness or different thicknesses, a contrast ratio or resolution of the displayed image can be improved, and color shift can be prevented from occurring, so as to display clearer image.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

The invention claimed is:

1. A monochrome light emitting display device comprising:
  a display panel having unit pixels of first and second sub-pixels arranged in a matrix arrangement to display a monochrome image;
  gate and data drivers respectively driving gate lines and data lines of the display panel; and
  a timing controller that aligns externally input RGB data to be suitable for driving of the display panel to supply the RGB data to the data driver and generates data and gate control signals to control the data and gate drivers,
  wherein each of the first and second sub-pixels includes at least one switching device and at least one light emitting cell,
  wherein the light emitting cell includes a first electrode and an organic light emitting layer formed a surface of the first electrode and a second electrode formed a surface of the organic emitting layer,
  wherein the organic light emitting layer formed in the first sub-pixel having a thickness same from that of the organic light emitting layer formed in the second sub-pixel,
  wherein the first electrode of the light emitting cell formed in the first sub-pixel having a thickness different from that of the first electrode of the light emitting cell formed in the second sub-pixel, and
  wherein the unit pixels have the same size and the first sub-pixel and the second sub-pixel in each unit pixel have different size.

2. The monochrome light emitting display device as claimed in claim 1, wherein each of the first and second sub-pixels constituting each unit pixel has a vertical stripe type or a horizontal stripe type.

3. The monochrome light emitting display device as claimed in claim 2, wherein each of the first and second sub-pixels is not provided with a color filter.

4. The monochrome light emitting display device as claimed in claim 1, wherein each unit pixel of the first and second sub-pixels is formed at a size of ⅔ of a unit pixel of red, green and blue sub-pixels.

5. A method for fabricating a monochrome light emitting display device that includes a monochrome light emitting display panel, drivers driving the monochrome light emitting display panel, and a timing controller controlling the drivers, the method comprising:
  fabricating the monochrome display panel by arranging unit pixels of first and second sub-pixels in a matrix arrangement to display a monochrome image,
  wherein the step of fabricating the monochrome display panel further includes forming at least one switching device and at least one light emitting cell,
  wherein the light emitting cell includes a first electrode and an organic light emitting layer formed a surface of the first electrode and a second electrode formed a surface of the organic light emitting layer,
  wherein the organic light emitting layer formed in the first sub-pixel having a thickness same from that of the organic light emitting layer formed in the second sub-pixel,
  wherein the first electrode of the light emitting cell formed in the first sub-pixel includes a first electrode having a thickness different from that of the first electrode of the light emitting cell formed in the second sub-pixel, and
  wherein the unit pixels have the same size and the first sub-pixel and the second sub-pixel in each unit pixel have different size.

6. The method as claimed in claim 5, wherein the step of fabricating the monochrome display panel includes forming each of the first and second sub-pixels constituting each unit pixel in a vertical stripe type or a horizontal stripe type.

7. The method as claimed in claim 6, wherein, in the step of fabricating the monochrome display panel, each of the first and second sub-pixels is not provided with a color filter.

8. The method as claimed in claim 5, wherein the step of fabricating the monochrome display panel includes forming each unit pixel of the first and second sub-pixels at a size of ⅔ of a unit pixel formed by red, green and blue sub-pixels.

9. A monochrome light emitting display device comprising:
  a display panel having unit pixels of first and second sub-pixels arranged in a matrix arrangement to display a monochrome image;
  gate and data drivers respectively driving gate lines and data lines of the display panel; and a timing controller that aligns externally input RGB data to be suitable for driving of the display panel to supply the RGB data to the data driver and generates data and gate control signals to control the data and gate drivers, wherein each of the first and second sub-pixels includes at least one switching device and at least one light emitting cell, wherein the light emitting cell includes a first electrode and an organic light emitting layer formed a surface of the first electrode and a second electrode formed a surface of the organic light emitting layer, wherein the organic light emitting layer formed in the first sub-pixel having a thickness same from that of the organic light emitting layer formed in the second sub-pixel, wherein the first electrode of the light emitting cell formed in the first sub-pixel having a thickness different from that of the first electrode of the light emitting cell formed in the second sub-pixel, and wherein the first sub-pixel has a size greater than that of the second sub-pixel and the first electrode in the first sub-pixel is thinner than the second electrode in the second sub-pixel.

* * * * *

UNITED STATES PATENT AND TRADEMARK OFFICE
CERTIFICATE OF CORRECTION

PATENT NO. : 8,890,899 B2  
APPLICATION NO. : 12/646256  
DATED : November 18, 2014  
INVENTOR(S) : Se-Hee Lee et al.

Page 1 of 1

It is certified that error appears in the above-identified patent and that said Letters Patent is hereby corrected as shown below:

In the Claims

Column 11, claim 1, line 67, after "the organic" insert --light--.

Signed and Sealed this
Fourteenth Day of April, 2015

Michelle K. Lee
*Director of the United States Patent and Trademark Office*